United States Patent
Sato

(10) Patent No.: US 9,106,180 B2
(45) Date of Patent: Aug. 11, 2015

(54) VARIABLE PHASE SHIFTER, SEMICONDUCTOR INTEGRATED CIRCUIT AND PHASE SHIFTING METHOD

(71) Applicant: FUJITSU LIMITED, Kawasaki-shi, Kanagawa (JP)

(72) Inventor: Masaru Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/029,040

(22) Filed: Sep. 17, 2013

(65) Prior Publication Data

US 2014/0152347 A1 Jun. 5, 2014

(30) Foreign Application Priority Data

Nov. 30, 2012 (JP) ................. 2012-263231

(51) Int. Cl.
*G06F 7/44* (2006.01)
*G06G 7/16* (2006.01)
*H03B 21/00* (2006.01)
*H03H 11/20* (2006.01)

(52) U.S. Cl.
CPC ............... *H03B 21/00* (2013.01); *H03H 11/20* (2013.01)

(58) Field of Classification Search
USPC .................................................. 327/105–361
See application file for complete search history.

(56) References Cited

U.S. PATENT DOCUMENTS

| 4,283,684 A | 8/1981 | Satoh | |
|---|---|---|---|
| 4,297,641 A | 10/1981 | Sterzer | |
| 4,379,264 A | 4/1983 | Lenhardt | |
| 6,831,497 B2 * | 12/2004 | Koh et al. | 327/254 |
| 6,856,269 B1 | 2/2005 | Shih | |
| 2003/0117200 A1 * | 6/2003 | Koh et al. | 327/238 |
| 2008/0139162 A1 * | 6/2008 | Hafizi | 455/325 |
| 2009/0075619 A1 * | 3/2009 | Mitomo et al. | 455/325 |
| 2010/0085104 A1 * | 4/2010 | Yotsuji | 327/356 |
| 2011/0001522 A1 * | 1/2011 | Chan et al. | 327/118 |
| 2011/0215844 A1 * | 9/2011 | Trotta et al. | 327/122 |
| 2014/0070866 A1 * | 3/2014 | Chiu et al. | 327/355 |

FOREIGN PATENT DOCUMENTS

| JP | H9-205301 | 8/1997 |
|---|---|---|
| JP | 2003-304136 A1 | 10/2003 |

OTHER PUBLICATIONS

P. Vadivelu, et al.; "Integrated CMOS mm-wave Phase Shifters for Single Chip Portable Radar;" IMS 2009; pp. 565-568.

(Continued)

*Primary Examiner* — Brandon S Cole
(74) *Attorney, Agent, or Firm* — Kratz, Quintos & Hanson, LLP

(57) ABSTRACT

A variable phase shifter. The variable phase shifter includes: a transmission line that outputs quadrature signals from a pair of output ports in response to an input signal of a specific frequency; a synthesizer that includes a first transistor connected to a first port of the pair of output ports and a second transistor connected to a second port of the pair of output ports, and that on input of the input signal takes signals output from the pair of output ports of the transmission line with a phase according to their respective load impedances and employs the first and the second transistors to amplify and combine the signals; and a phase controller that controls the phase of the output signal that is combined and output by the synthesizer by controlling the amplification operation of each of the first and second transistors of the synthesizer.

18 Claims, 11 Drawing Sheets

(56) References Cited

OTHER PUBLICATIONS

Extended European Search Report dated May 26, 2015, from corresponding EP Patent Application No. 13183799.9.
Jyoti P Mondal et al; "Phase Shifts in Single- and Dual-Gate GaAs MESFET's for 2-4-GHz Quadrature Phase Shifters", IEEE Transactions on Microwave Theory and Techniques, vol. MTT-32, No. 10, Oct. 1984, pp. 1280-1288.
K Hayashi at al; "An MMIC active phase shifter using a variable resonant circuit" Microwave Symposium Digest, 1998, vol. 3, Jun. 7, 1998, pp. 1573-1576.
Selin J R; "Continuously Variable L- Band Monolithic GAAS Phase Shifter", Microwave Journal, vol. 30, No. 9, Sep. 1987, pp. 211-218.

* cited by examiner

FIG.7

BIAS CONDITIONS

|  | Va(v) | Vb(v) | Vg (SWITCH) |
|---|---|---|---|
| Case1 | 0.80 | 0.00 | Hi |
| Case2 | 0.80 | 0.20 | Hi |
| Case3 | 0.80 | 0.40 | Hi |
| Case4 | 0.80 | 0.60 | Hi |
| Case5 | 0.80 | 0.80 | Hi |
| Case6 | 0.60 | 0.80 | Hi |
| Case7 | 0.40 | 0.80 | Hi |
| Case8 | 0.00 | 0.80 | Hi |
| Case9 | 0.45 | 0.00 | Low |

VARIABLE PHASE SHIFTER, SEMICONDUCTOR INTEGRATED CIRCUIT AND PHASE SHIFTING METHOD

CROSS-REFERENCE TO RELATED APPLICATION

This application is based upon and claims the benefit of priority of the prior Japanese Patent Application No. 2012-263231, filed on Nov. 30, 2012, the entire contents of which are incorporated herein by reference.

FIELD

The embodiments discussed herein are related to a variable phase shifter, a semiconductor integrated circuit and a phase shifting method.

BACKGROUND

Variable phase shifters that change the phase of a signal are employed for example in high frequency communication equipment. Variable phase shifters are also employed to shift the phase of a phased array antenna employed in high frequency communication.

Examples of variable phase shifters include for example those in which variable capacitors are connected in parallel to a coupled transmission line. In such a variable phase shifter, the phase can be varied over a range of 100° or greater by voltage control to change the capacity that is connected to the transmission line, however there is a large change in the amplitude of the phase-shifted signal.

As a method to achieve a variable range of phase from 0° to 360° whilst suppressing changes in amplitude there is a method that employs a quadrature generator and a vector-synthesizer. In this method, quadrature signals I (0°), Q (90°), I' (180°), and Q' (270°) are generated by the quadrature generator and combined by the vector-synthesizer.

As another method to achieve a variable range of phase from 0° to 360° whilst suppressing changes in amplitude there is a method that employs a discrete phase shifter that outputs discrete quadrature signals, and a reflection phase shifter that varies the phase of an input signal over a range of 0° to 90°. In such a method a phase divider is employed to output signals of each phase of 0°, 90°, 180°, and 270° to the discrete phase shifter. The variable phase shifter employing the phase divider inputs a signal of one of the phases output from the phase divider to the reflection phase shifter, and the reflection phase shifter changes the phase over a range of 0° to 90°. The variable phase shifter employing the phase divider thereby has a variable range of phase from 0° to 360°.

However, in a quadrature generator and a discrete phase shifter, when signals are generated at each phase of 0°, 90°, 180°, and 270° there is, for example, a balun is needed for outputting signals at 0° and 180°. Moreover, in a quadrature generator and a discrete phase shifter, a 90° hybrid coupler is needed for outputting signals with a phase difference of 0° and 90° for each of the signals output from the balun. The balun and hybrid coupler occupy the majority of device surface area of a variable phase shifter and accordingly impede reducing device surface area.

There is a variable phase shifter that employs two variable amplifier means to suppress changes in amplitude by controlling such that amplitude characteristics of each of the variable amplifier means are correlated with each other. In such a variable phase shifter, signals with a phase difference 90° divided by a power divider means are amplified by the variable amplifier means and then combined by a power combining means, such that the phase of the output signal varies in a range of 0° to 90°.

RELATED PATENT DOCUMENTS

Japanese Laid-Open Publication No. 09-205301
Japanese Laid-Open Publication No. 2003-304136

RELATED NON-PATENT DOCUMENT

P. Vadievelu, et. al, "Integrated CMOS mm-wave Phase Shifters for Single Chip Portable Radar", IMS2009, pp. 565-568.

SUMMARY

According to an aspect of the embodiments, a variable phase shifter includes: a transmission line that outputs quadrature signals from a pair of output ports in response to an input signal of a specific frequency; a synthesizer that includes a first transistor connected to a first port of the pair of output ports and a second transistor connected to a second port of the pair of output ports so that parasitic capacitance becomes load impedance for the transmission line, and that on input of the input signal takes signals output from the pair of output ports of the transmission line with a phase according to their respective load impedances and employs the first and the second transistors to amplify and combine the signals; and a phase controller that controls the phase of the output signal that is combined and output by the synthesizer by controlling the amplification operation of each of the first and second transistors of the synthesizer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a table illustrating combinations of bias states applied to a simulation according to the present exemplary embodiment;

DESCRIPTION OF EMBODIMENTS

Figure 1:
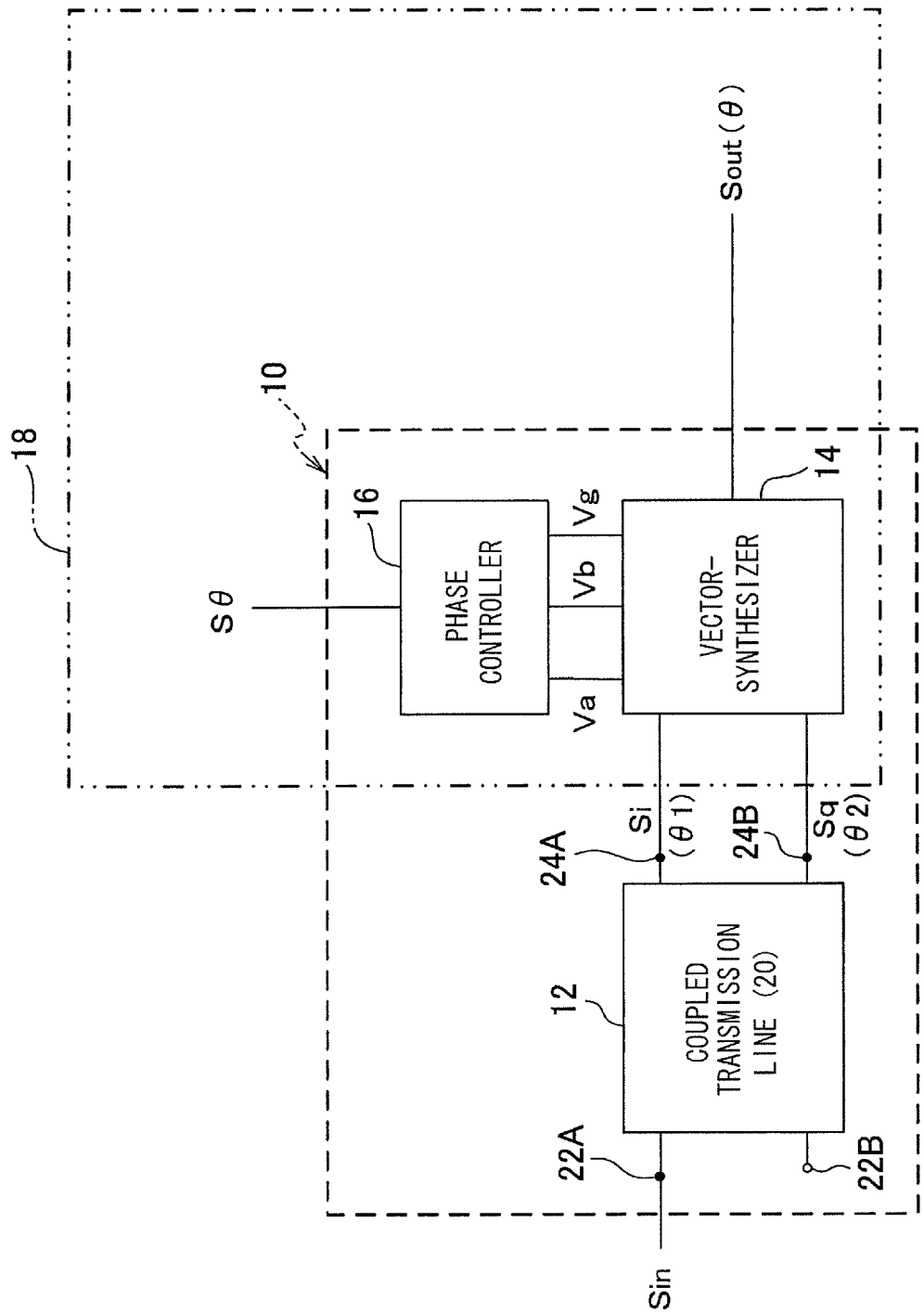
FIG. 1 is a functional block diagram illustrating an example of a variable phase shifter according to the present exemplary embodiment.

Detailed explanation follows regarding an example of an exemplary embodiment of technology disclosed herein, with reference to the drawings. FIG. 1 illustrates a variable phase shifter 10 according to the present exemplary embodiment. The variable phase shifter 10 functions as an example of a variable phase shifter according to technology disclosed herein. On input with an input signal Sin of specific frequency F, the variable phase shifter 10 outputs an output signal Sout of frequency F. When this is performed the variable phase shifter 10 controls the phase θ of the output signal Sout.

The variable phase shifter 10 according to the present exemplary embodiment may be employed as part of a phase modulator in transmission equipment or a high frequency communication system, such as a high frequency transmitter that performs phase modulation. The variable phase shifter 10 may be employed in high frequency transmission equipment or a high frequency transmission system employing a phased array antenna such as in a phase array radar. The variable phase shifter 10 may be employed as part of a phase shifter that switches beam direction of a transmission wave or a vector-synthesized phase modulator in high frequency transmission equipment or a high frequency communication system using a phased array antenna. The variable phase shifter 10 may also be employed as part of a device that performs phased array antenna modulation in a high frequency communication system employing a phased array antenna.

The variable phase shifter 10 employs frequencies of for example 1.5 GHz to 100 GHz as the frequency F of an input signal Sin. Namely, the variable phase shifter 10 may be employed in a high frequency communication system that uses electromagnetic waves of wavelengths such as microwaves or milliwaves. Note that the frequency F employed in the variable phase shifter 10 is not limited to being in the range of 1.5 GHz to 100 GHz, and may be lower than 1.5 GHz, or may be higher than 100 GHz.

As illustrated in FIG. 1, the variable phase shifter 10 includes a coupled transmission line 12, a vector-synthesizer 14 and a phase controller 16. In the present exemplary embodiment, the coupled transmission line 12 functions as an example of a transmission line, the vector-synthesizer 14 functions as an example of a synthesizer, and the phase controller 16 functions as an example of a phase controller.

The variable phase shifter 10 according to the present exemplary embodiment may for example be formed on a semiconductor integrated circuit 18. Alternatively, the variable phase shifter 10 may for example be formed with the coupled transmission line 12 connected to the semiconductor integrated circuit 18 provided with the vector-synthesizer 14 and the phase controller 16.

Figure 2:
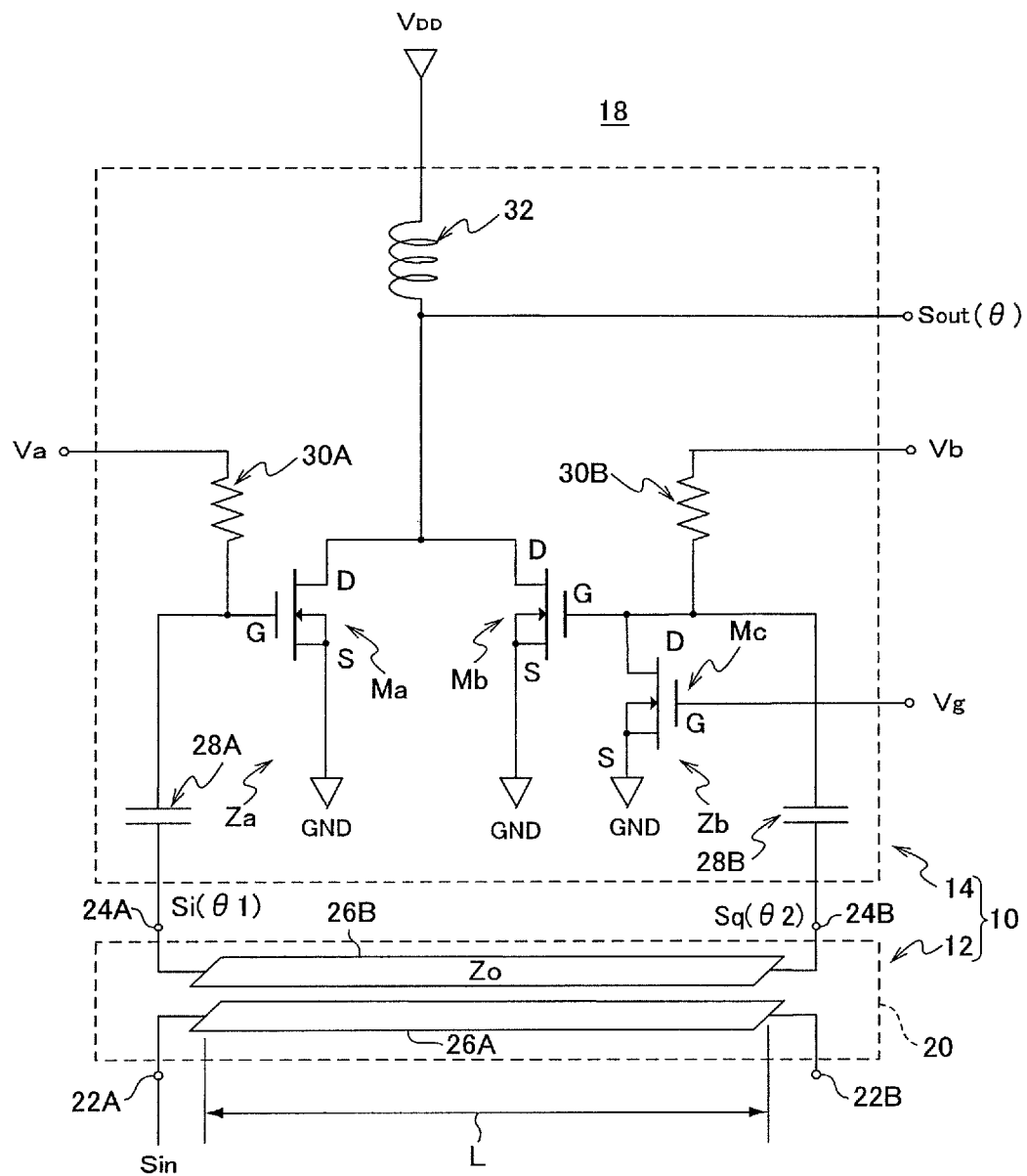
FIG. 2 is a block diagram illustrating an example of a coupled transmission line and vector-synthesizer of a variable phase shifter.

As illustrated in FIG. 1 and FIG. 2, the variable phase shifter 10 is input with an input signal Sin to the coupled transmission line 12. FIG. 2 illustrates an example of the coupled transmission line 12 and the vector-synthesizer 14 of the variable phase shifter 10.

The coupled transmission line 12 includes a 90° hybrid coupler (referred to below as hybrid 20) corresponding to the frequency F of the input signal Sin. The hybrid 20 is provided with a port 22A and a port 22B as input ports, and with a port 24A and a port 24B as output ports. Moreover, the hybrid 20, for example, includes lines 26A, 26B that are each formed so as to have a line length L of λ/4 with respect to wavelength λ of the input signal Sin of frequency F, and to have a specific characteristic impedance Zo (for example Zo=50Ω).

In the hybrid 20 the port 22A is connected to one end of the line 26A, and the port 22B is connected to the other end of the line 26A. Moreover, in the hybrid 20, the port 24A is connected to one end of the line 26B, and the port 24B is connected to the other end of the line 26B.

In the variable phase shifter 10 the input signal Sin is input to the port 22A of the hybrid 20. In the hybrid 20, the line 26A and the line 26B are in a non-coupled state with respect to direct current, but are in a coupled state with respect to alternating current. In the hybrid 20, due to the lines 26A, 26B being in a coupled state with respect to alternating current, a signal corresponding to input signal Sin is generated in the line 26B on input through the port 22A to the line 26A with the input signal Sin of frequency F.

Figure 5:
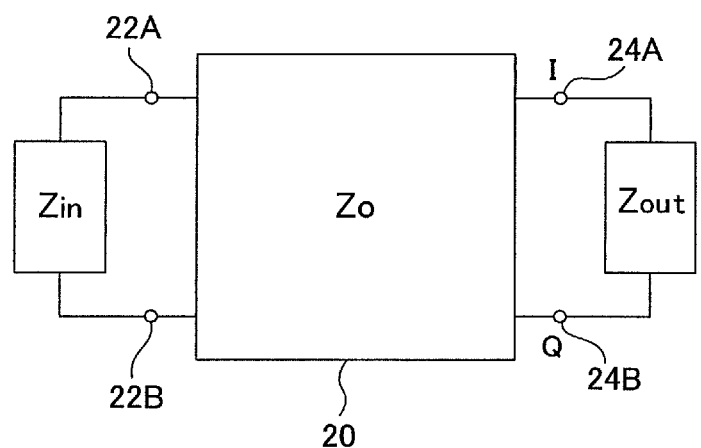
FIG. 5 is a functional block diagram illustrating an example of a hybrid in general use.

As illustrated in FIG. 5, in the hybrid 20 generally input impedance Zin that is connected to the ports 22A, 22B and output impedance that is connected to the ports 24A, 24B that are respectively matched to the characteristic impedance Zo are employed. When this occurs in the hybrid 20, a reflected wave is generated in the line 26B, and the phase of the output occurring at the port 24B is shifted by 90° with respect to output occurring at the port 24A. Namely, when in the hybrid 20 the output occurring at the port 24A is a signal I that is in-phase with respect to the signal input to the ports 22A, 22B, the output occurring at the port 24B is a quadrature signal Q thereto.

The hybrid 20 accordingly has a general function such that signals I, Q that are orthogonal in phase to each other occur at the ports 24A, 24B when the load of the output impedance Zout matched to the characteristic impedance Zo is connected to the ports 24A, 24B. Note that in the present exemplary embodiment, although explanation is of an example in which the hybrid 20 is employed, the coupled transmission line 12 may employ any given transmission line that outputs signals I, Q that are orthogonal in phase to each other when load is matched.

As illustrated in FIG. 1 and FIG. 2, in the variable phase shifter 10 each of the ports 24A, 24B of the hybrid 20 is connected to the vector-synthesizer 14. The variable phase shifter 10 accordingly inputs a signal output from the port 24A of the hybrid 20 (referred to below as signal Si) and inputs a signal output from the port 24B of the hybrid 20 (referred to below as signal Sq) to the vector-synthesizer 14.

Moreover, the variable phase shifter 10 is configured with the port 22B of the hybrid 20 open, such that total reflection occurs at the end portion of the line 26A on the port 22B side in response to the input signal Sin of frequency F input from the port 22A. Thus in the hybrid 20 improved transmission efficiency is achieved when the input signal Sin is transmitted to the line 26B. Note that the variable phase shifter 10 may matched for example by connecting an impedance load corresponding to the characteristic impedance Zo of the hybrid 20 to the port 22B of the hybrid 20.

The vector-synthesizer 14 of the variable phase shifter 10 separately amplifies the signal Si and the signal Sq input from the hybrid 20, combines the amplified signals together and then outputs as output signal Sout. When this occurs in the hybrid 20, a phase θ1 of the signal Si output from the port 24A is different to a phase θ2 of the signal Sq output from the port 24B. The phase controller 16 of the variable phase shifter 10 shifts the phase θ of the output signal Sout by controlling the amplification of the signal Si of phase θ1 and the phase θ2 of signal Sq in the vector-synthesizer 14.

As illustrated in FIG. 2, the vector-synthesizer 14 provided to the variable phase shifter 10 includes transistors Ma, Mb.

The vector-synthesizer 14 includes a transistor Mc. In the present exemplary embodiment, the transistor Ma functions as an example of a first transistor, the transistor Mb functions as an example of a second transistor, and the transistor Mc functions as an example of a third transistor. Moreover, in the present exemplary embodiment, the transistor Mc functions as an example of a switch member, and functions as an example of an electrostatic capacitance element.

A bipolar transistor or a field effect transistor (FET) may be employed as the transistors Ma, Mb, Mc. In the present exemplary embodiment, negative channel Metal Oxide Semiconductor transistors (NMOS transistors) formed as FETs on a semiconductor integrated circuit 18 are employed as an example of the transistors Ma, Mb, Mc.

The gate G of the transistor Ma is connected through a DC cut capacitor 28A to the one port 24A of the hybrid 20. The gate G of the transistor Mb is connected through a DC cut capacitor 28B to the other port 24B of the hybrid 20. Accordingly, in the vector-synthesizer 14, the signal Si output from the hybrid 20 is input to the gate G of the transistor Ma and the signal Sq output from the hybrid 20 is input to the gate G of the transistor Mb.

Moreover, in the vector-synthesizer 14 a bias voltage Va is input through a bias resistor 30A to the gate G of the transistor Ma, and a bias voltage Vb is input through a bias resistor 30B to the gate G of the transistor Mb. Consequently, in the vector-synthesizer 14 each of the transistors Ma, Mb forms a grounded source amplification circuit, and the transistors Ma, Mb amplify and output the signals Si, Sq according to the bias voltages Va, Vb. When doing so, the capacitors 28A, 28B prevent the direct current component due to the bias voltages Va, Vb input to the transistors Ma, Mb from flowing around and into the hybrid 20.

The drain D of the transistor Ma in the vector-synthesizer 14 is connected to the drain D of the transistor Mb. Moreover, a power source voltage VDD is supplied through the inductor 32 of a specific inductance to the drains D of each of the transistors Ma, Mb.

Thereby, in the vector-synthesizer 14, the signal Si is amplified by the transistor Ma, and the signal Sq is amplified by the transistor Mb, and then the amplified signals are combined together and output as the output signal Sout. When this occurs, the output impedance of the vector-synthesizer 14 is determined by the output impedances of the transistors Ma, Mb and the inductance of the inductor 32. The variable phase shifter 10 is accordingly configured to achieve a matching of impedance of the vector-synthesizer 14 due to the impedance of the inductor 32 with the impedance of the functional components at stages following the vector-synthesizer 14.

The source S of the transistor Mc is connected to ground, and the drain D of the transistor Mc is connected to the gate G of the transistor Mb. The transistor Mc functions as a switching element that is switched ON by applying a gate voltage Vg of a specific voltage value to the gate G. In the vector-synthesizer 14, by switching the transistor Mc ON, a conducting state arises between the drain D and the source S of the transistor Mc. Moreover, in the vector-synthesizer 14 a non-conducting state arises between the drain D and the source S of the transistor Mc by stopping the gate voltage Vg and switching OFF the transistor Mc.

In the variable phase shifter 10, the phase controller 16 controls bias voltages Va, Vb of the transistors Ma, Mb and the gate voltage Vg of the transistor Mc that are provided in the vector-synthesizer 14.

Note that the vector-synthesizer 14 according to the present exemplary embodiment for example employs electrostatic capacitance elements having equivalent capacities to each other as the capacitors 28A, 28B. The vector-synthesizer 14 according to the present exemplary embodiment for example employs resistance elements having equivalent resistance values to each other as the bias resistors 30A, 30B. The capacity of the capacitors 28A, 28B and the resistance values of the bias resistors 30A, 30B are however not limited to the configuration of the present exemplary embodiment. Moreover, the vector-synthesizer 14 according to the present exemplary embodiment is not limited to a configuration provided with the capacitor 28A between the transistor Ma and the port 24A and provided with the capacitor 28B between the transistor Mb and the port 24B. The vector-synthesizer 14 may be provided with one or other or both of the capacitors 28A, 28B as a CD cut capacitor.

The transistors Ma, Mb, Mc contain P-N junctions. Parasitic capacitance arises in semiconductor elements such as the transistors Ma, Mb, Mc due to containing P-N junctions. In the transistors Ma, Mb, Mc, high frequency characteristics are influenced by the parasitic capacitance, and the smaller the parasitic capacitance the higher the frequency communication band. The parasitic capacitance differs according to transistor size, with the parasitic capacitance being small when the transistor size is small.

Moreover, the transistors Ma, Mb, Mc that are employed in microwave and milliwave bands have frequency characteristics that contain frequencies of microwaves and milliwaves in the frequency communication band. The transistors Ma, Mb, Mc with high frequency characteristics in the frequency communication band have smaller parasitic capacitance than transistors with low frequency characteristics in the frequency communication band. Consequently, in the variable phase shifter 10 the transistors Ma, Mb, Mc have small parasitic capacitance matched to frequencies of both microwaves and milliwaves bands. In the variable phase shifter 10 the transistor size of each of the transistors Ma, Mb, Mc is set such that the parasitic capacitance is a specific capacitance.

Figure 3:
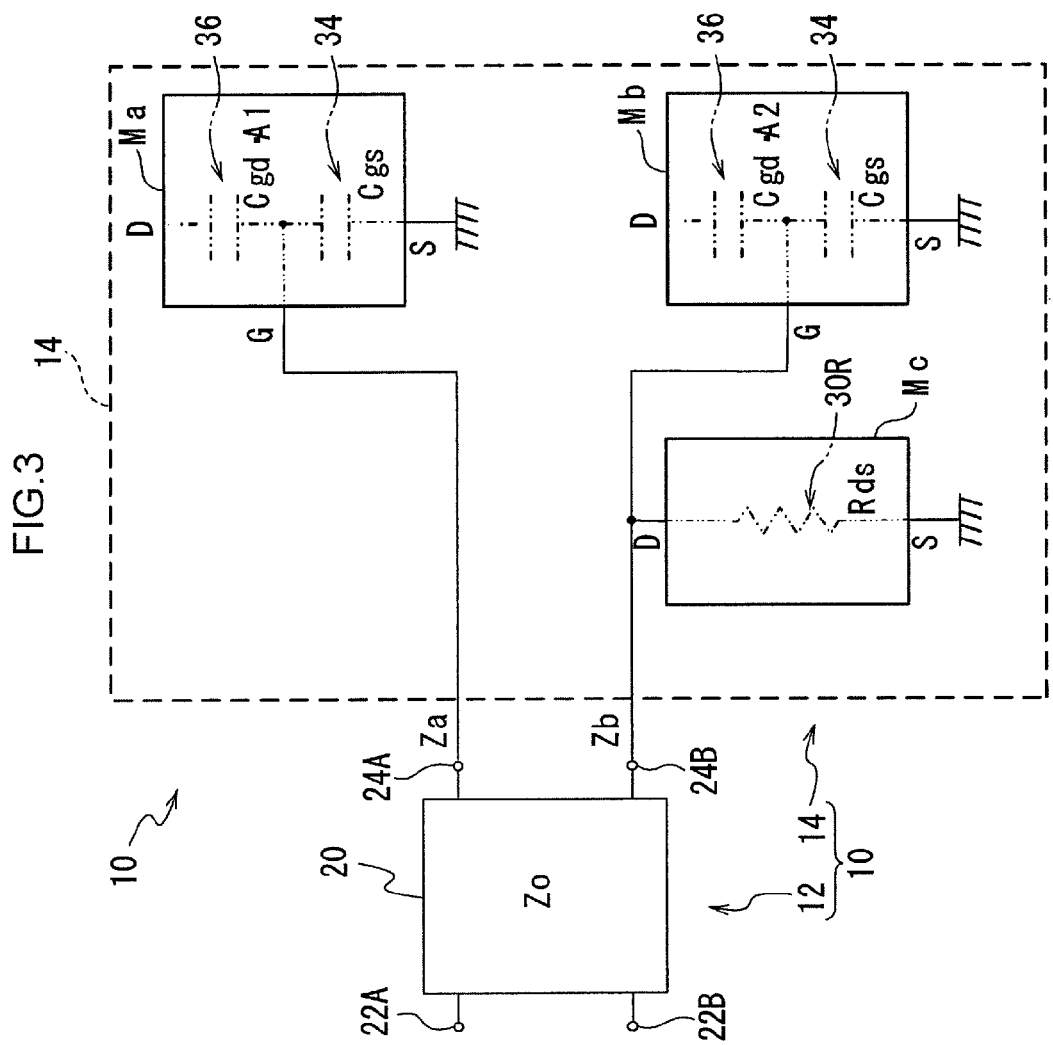
FIG. 3 is a block diagram illustrating load impedance for a hybrid coupler.
Figure 4:
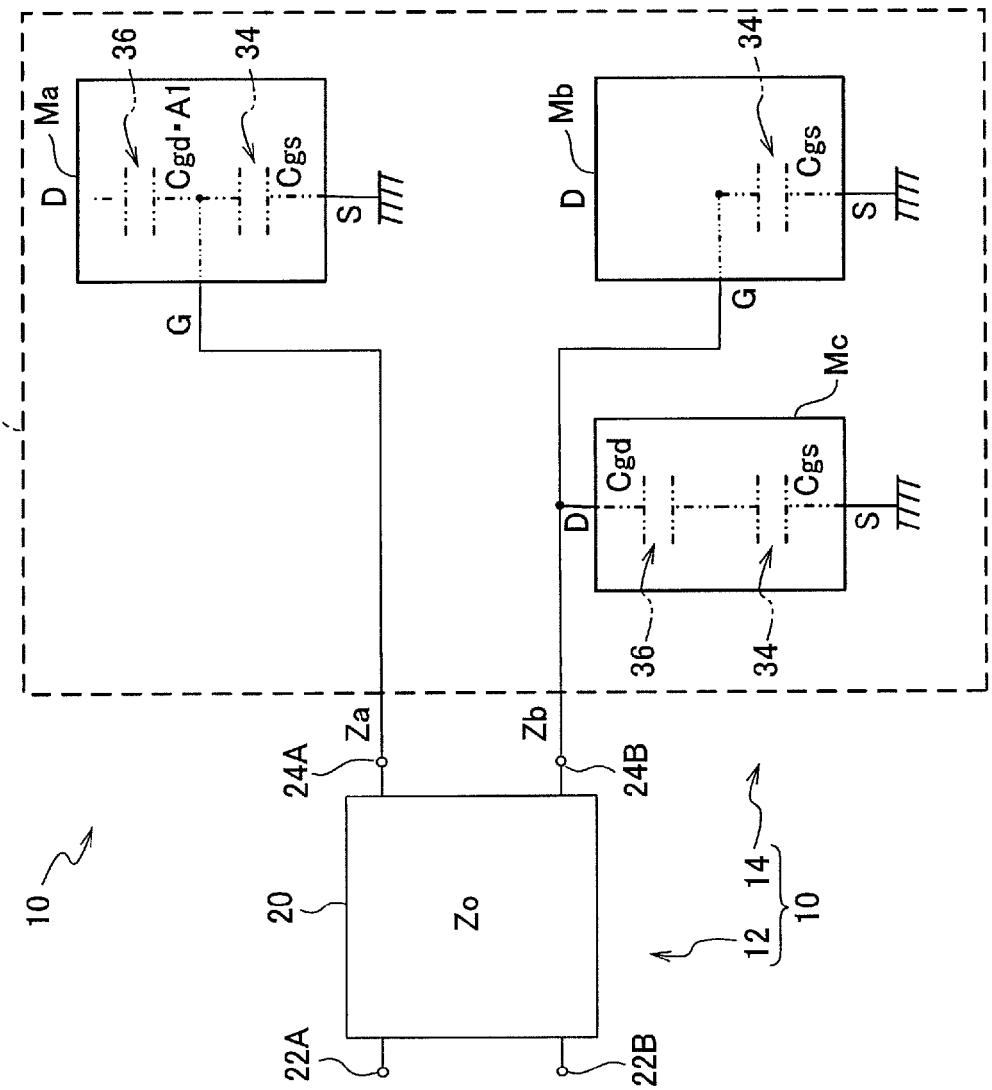
FIG. 4 is a block diagram illustrating an example of a bias state of the vector-synthesizer illustrated in FIG. 3.

As illustrated in FIG. 3 and FIG. 4, the parasitic capacitance between the gate G and the source S (referred to below as the capacitance Cgs of a capacitor 34) serves as parasitic capacitance of the transistors Ma, Mb, Mc. Moreover, the parasitic capacitance between the gate G and the drain D (referred to below as the capacitance Cgd of a capacitor 36) also serves as parasitic capacitance of the transistors Ma, Mb, Mc.

The transistors Ma, Mb, and the transistor Mc according to the present exemplary embodiment are formed so as to be applicable to processing at frequency F that lies in the microwave and milliwave frequency band. Consequently, the capacitances Cgs, Cgd of the transistors Ma, Mb, Mc are significantly smaller than the parasitic capacitance of transistors employed in low frequency bands. For example, the transistors Ma, Mb and the transistor Mc employ transistors with capacitance Cgs of the capacitor 34 and capacitance Cgd of the capacitor 36 that are for example from several fF (femto Farad, $10^{-15}$F) to several 10s of fF.

In the vector-synthesizer 14 the sources S of the transistors Ma, Mb are connected to ground, and the gate G of the transistor Ma is connected to the port 24A of the hybrid 20. In the vector-synthesizer 14 the gate G of the transistor Mb is connected to the port 24B of the hybrid 20.

Amplification operation is stopped by achieving a disconnected state between the drain D and the source S in the transistors Ma, Mb by application of 0v as the bias voltages Va, Vb. In the disconnected state of the transistors Ma, Mb, the capacitance Cgs of the capacitor 34 serves as input impedance. Namely, as illustrated in FIG. 4 for example, in the transistor Mb the input impedance is determined by the capacitance Cgs of the capacitor 34 by making the bias voltage Vb 0v.

Note that FIG. 3 illustrates a state in which the specific bias voltages Va, Vb are applied to the transistors Ma, Mb (amplification operation), and the transistor Mc is ON. FIG. 4 illustrates a state in which a specific bias voltage Va is applied to the transistor Ma, and the bias voltage Vb of the transistor Mb is 0v (amplification operation is stopped), and the transistor Mc is OFF. Explanation follows regarding an example in which transistors Ma, Mb, Mc having equivalent electrical properties to each other are employed, and the capacitances Cgs, Cgd are also equivalent to each other. The electrical properties including the capacitances Cgs, Cgd are preferably equivalent to each other at least between the transistors Ma, Mb, however the transistor Mc may have different electrical properties and a different transistor size different to those of the transistors Ma, Mb.

The transistors Ma, Mb operate as amplifiers in a non-saturated region over a range in which the bias voltages Va, Vb are above a threshold value Vt but less than a voltage at the threshold value Vt distance away from the drain voltage Vd, a difference (Vd−Vt). Namely, the transistors Ma, Mb operate as amplifiers when the bias voltages Va, Vb are Vt<Va, Vt<Vb, and when Va<Vd−Vt, Vb<Vd−Vt.

As illustrated in FIG. 3, when the transistor Ma is operating as an amplifier, the input impedance is changed by an amplification ratio A1 corresponding to the capacitance Cgs of the capacitor 34, the capacitance Cgd of the capacitor 36 and the bias voltage Va. Moreover, when the transistor Mb is operating as an amplifier, the input impedance is changed by an amplification ratio A2 corresponding to the capacitance Cgs of the capacitor 34, the capacitance Cgd of the capacitor 36 and the bias voltage Vb. Namely, when the transistors Ma, Mb are operating in a linear region, the input impedance varies according to the bias voltages Va, Vb and the capacitances Cgs, Cgd.

As illustrated in FIG. 2, in the vector-synthesizer 14 the gate G of the transistor Ma is connected to the port 24A of the hybrid 20. The gate G of the transistor Mb is connected to the port 24B of the hybrid 20. Consequently, as illustrated in FIG. 3 and FIG. 4, in the vector-synthesizer 14 the input impedance of the transistor Ma gives rise to a load impedance Za connected to the port 24A of the hybrid 20. In the vector-synthesizer 14 the input impedance of the transistor Mb is contained in a load impedance Zb connected to the port 24B of the hybrid 20.

The transistor Mc functions as a switching element by switching gate voltage Vg between Vg>Vd−Vt (saturated region) and Vg=0v. As illustrated in FIG. 4, the output impedance of the transistor Mc in the OFF state (Vg=0v) is the combined capacitance of the capacitances Cgs, Cds. Moreover, as illustrated in FIG. 3, there is a parasitic resistance 30R present between the drain D and the source S in the transistor Mc, with the parasitic resistance 30R arising when the transistor Mc is ON.

Generally with capacitance, capacitance functions as impedance according to the frequency, with the impedance becoming higher as frequency gets lower, and with the impedance becoming lower as the frequency is raised. Moreover, generally impedance arising from a resistance value Rds of the parasitic resistance 30R is smaller than the impedance arising from the capacitances Cgs, Cds of the capacitors 34, 36. Thus in the transistor Mc, the output impedance in the ON state (Vg>Vd−Vt) may be taken as the resistance value Rds of the parasitic resistance 30R.

As illustrated in FIG. 2, in the vector-synthesizer 14, the drain D of the transistor Mc is connected to the port 24B of the hybrid 20. Consequently, as illustrated in FIG. 3 and FIG. 4, in the vector-synthesizer 14 the output impedance of the transistor Mc is contained in the load impedance Zb connected to the port 24B of the hybrid 20. Accordingly, in the vector-synthesizer 14 the load impedance Zb is greater when the transistor Mc is in the ON state than when the transistor Mc is in the OFF state.

Thus in the transistors Ma, Mb, Mc employed at the frequency F lying in the microwave and milliwave frequency bands, the capacitances Cgs, Cgd are from several fF to several 10s of fF. Thus when the frequency F is low, the input impedance of the transistors Ma, Mb is high. However, the input impedance of the transistors Ma, Mb is low to the frequency F lying in the microwave and milliwave frequency bands, and the output impedance when the transistor Mc is in an ON state is an impedance corresponding to the capacitances Cgs, Cgd.

In the variable phase shifter 10, the capacitances Cgs, Cgd of the transistors Ma, Mb, Mc and the parasitic resistance 30R of the transistor Mc function as load impedance of the hybrid 20. At such times in the variable phase shifter 10, at frequency F the load impedance Za connected to the port 24A of the hybrid 20 and the load impedance Zb connected to the port 24B are configured so as to be lower than the characteristic impedance Zo of the hybrid 20.

Generally, in a transistor for which the frequency F is contained in the communication band, when the bias voltage Va=0v, the magnitude (absolute value) of the load impedance (input impedance) Za satisfies Za=1/(2π·F·Cp). Wherein capacitance Cp is parasitic capacitance arising when an input impedance is input to a normal sized transistor for which the frequency F is contained in the communication band (for example Cp=Cgs when the transistor is OFF).

At such times, when for example the frequency F=77 GHz and the capacitance Cp=100 fF, then the load impedance Za is about 20Ω. Moreover, when for example the frequency F=77 GHz and the capacitance Cp=50 fF, then the load impedance Za is about 41Ω. Moreover, when the load impedance Za=50Ω, the capacitance Cp is about 41 fF.

The hybrid 20 has a larger phase difference Δθ (absolute value) between phase θ1 of the signal Si and the phase θ2 of the signal Sq than 90° due to the load impedances Za, Zb being lower than the characteristic impedance Zo. Moreover, in the hybrid 20 the phase difference Δθ of the signals Si, Sq is at a maximum at 180° due to the load impedances Za, Zb being smaller than the characteristic impedance Zo. Note that in the hybrid 20, phase difference Δθ of the signals Si, Sq approaches 90° when the load impedances Za, Zb approach characteristic impedance Zo.

In the present exemplary embodiment, the parasitic capacitance of the transistors Ma. Mb is smaller than that of normal size transistors due to making the transistor size of the transistors Ma, Mb smaller than that of normal size transistors employed for processing signals of frequency F. In the present exemplary embodiment, the load impedances Za, Zb are made smaller than the characteristic impedance Zo of the hybrid 20 by making the parasitic capacitances smaller by making the transistor size of the transistors Ma, Mb smaller. In the present exemplary embodiment, for example, a transistor size is employed for the transistors Ma, Mb such that the capacitance Cgs, with respect to the capacitance Cp, satisfies Cgs<(Cp/5). Thus in the present exemplary embodiment, phase difference Δθ of the signals Si, Sq is near to 180°. Note that the transistors Ma, Mb are not limited to Cgs<(Cp/5), and any transistors may be employed as the transistors Ma, Mb as long as capacitances Cgs, Cgd are smaller than capacitance Cp. Preferably an even smaller transistor size is employed for the transistor Mc than for the transistors Ma, Mb in order to suppress the load impedance Zb in the OFF state.

As illustrated in FIG. 2, in the vector-synthesizer 14, the signal Si of phase θ1 is amplified by the transistor Ma, the signal Sq of phase θ2 is amplified by the transistor Mb, and each of the amplified signals are combined together. When this is performed, in the vector-synthesizer 14, the phase θ1 of the signal Si, the phase θ2 of the signal Sq, and the proportions of the signal Si and the signal Sq vary according to the bias voltages Va, Vb and the ON/OFF state of the transistor Mc. In the variable phase shifter 10 an output signal Sout is accordingly output from the vector-synthesizer 14 with variable phase θ.

As illustrated in FIG. 1, in the variable phase shifter 10 a phase instruction signal SO related to the phase of the output signal Sout is input to the phase controller 16. The phase controller 16 employs the phase designated by the phase instruction signal Sθ as a target value of phase θ of the output signal Sout, and outputs bias voltages Va, Vb corresponding to the phase instruction signal Sθ, and makes the gate voltage Vg ON/OFF according to the phase instruction signal Sθ.

Figure 6:
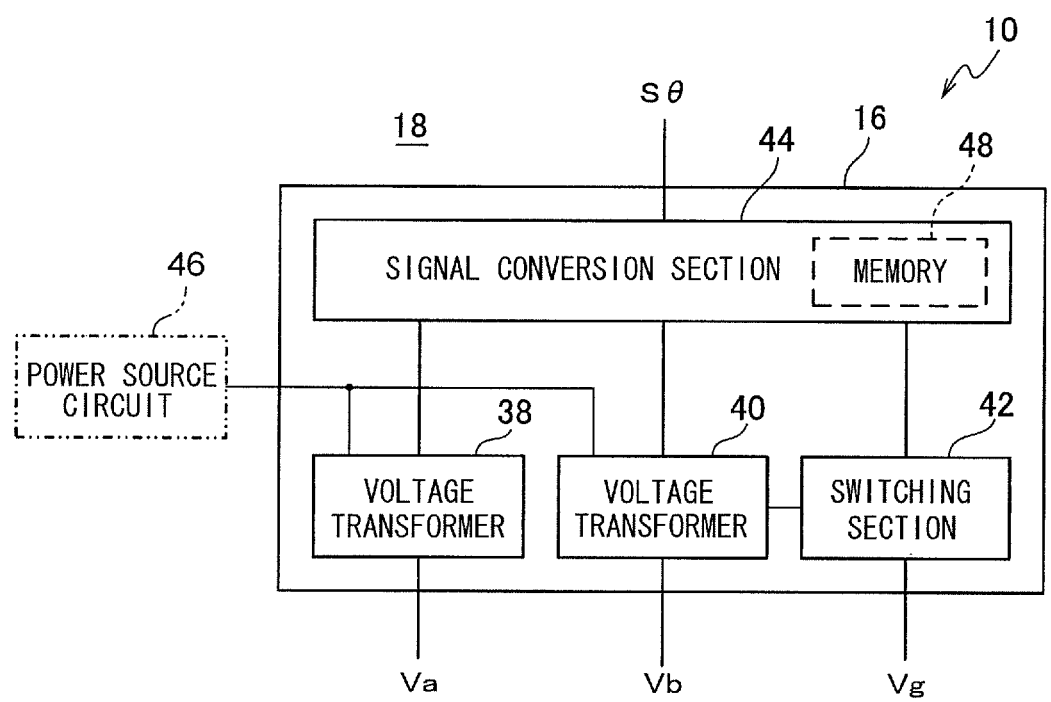
FIG. 6 is a functional block diagram illustrating an example of a phase controller.

As illustrated in FIG. 6, the phase controller 16 includes a voltage transformer 38 that outputs the bias voltage Va, a voltage transformer 40 that outputs the bias voltage Vb, and a switching section 42 that outputs the gate voltage Vg. The phase controller 16 also includes a signal conversion section 44. In the present exemplary embodiment, the voltage transformers 38, 40 function as examples of a power source section and the signal conversion section 44 functions as an example of a voltage controller.

In the voltage transformers 38, 40, a direct current power source of a specific voltage is supplied from a power source circuit 46 provided to the semiconductor integrated circuit 18. The voltage transformers 38, 40 convert the direct current voltage supplied from the power source circuit 46 into voltage values of plural predetermined steps, and then respectively output a direct current voltage of one of these voltage values as the bias voltages Va, Vb. Note that the voltage values of the bias voltages Va, Vb are referred to below as the bias voltages Va, Vb.

The voltage transformers 38, 40 output the bias voltages Va, Vb of voltage values instructed by the voltage value instruction signal output from the signal conversion section 44, from out of plural voltage values generated by DC-DC transformation.

Moreover, the switching section 42 is for example input with a direct current voltage of the specific voltage value generated by the voltage transformer 40. The switching section 42 outputs the direct current voltage input from the voltage transformer 40 as the gate voltage Vg. The switching section 42 does this by performing output start or output stop of the gate voltage Vg based on an instruction signal output from the signal conversion section 44. Note that the switching section 42 may be configured to convert the direct current voltage input from the power source circuit 46 into a specific voltage, for output as the gate voltage Vg.

In the variable phase shifter 10, the phase θ of the output signal Sout is controlled based on the phase instruction signal Sθ that instructs the phase θ of the output signal Sout. In the variable phase shifter 10, the phase instruction signal Sθ is input to the signal conversion section 44. Based on the phase instruction signal Sθ, the signal conversion section 44 controls the bias voltage Va (voltage value) output from the voltage transformer 38, the bias voltage Vb output from the voltage transformer 40, and output start/output stop of the gate voltage Vg by the switching section 42.

In the variable phase shifter 10 there are pre-set combinations of bias voltages Va, Vb and ON/OFF of the gate voltage Vg (the ON/OFF state of the transistor Mc) that are set for the phase θ of the output signal Sout. In the signal conversion section 44, for example, a table is stored in a memory 48 of combinations of the bias voltages Va, Vb and ON/OFF of the gate voltage Vg with respect to the phase θ or with respect to the phase instruction signal Sθ. By input of the phase instruction signal Sθ, the signal conversion section 44 accordingly controls the bias voltages Va, Vb and ON/OFF of the gate voltage Vg based on the phase instruction signal Sθ.

When the phase θ of the output signal Sout is varied according to the bias voltages Va, Vb and the gate voltage Vg, the output signal Sout of the vector-synthesizer 14 has an unstable phase θ unless the bias voltages Va, Vb are stabilized. In the phase controller 16, the voltage transformers 38, 40 accordingly output the bias voltages Va, Vb at pre-set voltage intervals.

Moreover, in the vector-synthesizer 14, the smaller the voltage intervals of the stepwise set bias voltages Va, Vb, the smaller the change intervals in the phase θ of the output signal Sout. The signal conversion section 44 accordingly performs time control on the bias voltages Va, Vb output from the voltage transformers 38, 40. Namely, the signal conversion section 44 controls the voltage transformer 38 so as to alternately output voltages V1, V2 in order to output a voltage Vn (V1<Vn<V2) between the pre-set voltages V1, V2 (V1<V2). Moreover, the signal conversion section 44 controls an output time t1 of the voltage V1 and an output time t2 of the voltage V2. When this is performed the output times t1, t2 are set based on the voltages V1, V2, Vn. Note that in the present exemplary embodiment, the voltages V1, V2, V3 respectively function as an example of a first voltage, a second voltage, and a third voltage.

Explanation follows regarding control of phase θ of the output signal Sout in the variable phase shifter 10. In the variable phase shifter 10, the hybrid 20 is employed in the coupled transmission line 12, the signal Si is output from the port 24A of the hybrid 20 to the vector-synthesizer 14, and the signal Sq is output from the port 24B to the vector-synthesizer 14.

The vector-synthesizer 14 of the variable phase shifter 10 is equipped with the transistors Ma, Mb, and the signal Si is amplified by the transistor Ma and the signal Sq is amplified by the transistor Mb. The vector-synthesizer 14 combines the signals that have been amplified by the transistors Ma, Mb and outputs the combined signal as the output signal Sout.

However, in the variable phase shifter 10, the load impedances Za, Zb with respect to the hybrid 20 are changed by the bias voltages Va, Vb of the transistors Ma, Mb of the vector-synthesizer 14 and the gate voltage Vg of the transistor Mc. The hybrid 20 thereby changes the phase θ1 of the signal Si output from the port 24A and the phase θ2 of the signal Sq output from the port 24B.

Moreover, in the vector-synthesizer 14, the ratio of the signals Si, Sq is changed by the amplification ratios A1, A2 that change according to the bias voltages Va, Vb of the transistors Ma, Mb. Thus in the variable phase shifter 10, the phase θ of the output signal Sout changes over a range from the phase θ1 of signal Si to the phase θ2 of signal Sq.

However, in the variable phase shifter 10, there is no matched state at the load side of the hybrid 20, and the load impedances Za, Zb are lower than the characteristic impedance Zo of the hybrid 20. Thus sometimes the transmission efficiency of the hybrid 20 falls, and the amplitude W of the output signal Sout would change greatly according to the phase θ of the output signal Sout. The variable phase shifter 10 however suppress changes in the amplitude W of the output signal Sout by changing the amplification ratios A1, A2 of the signals Si, Sq by the transistors Ma, Mb.

Figure 8:
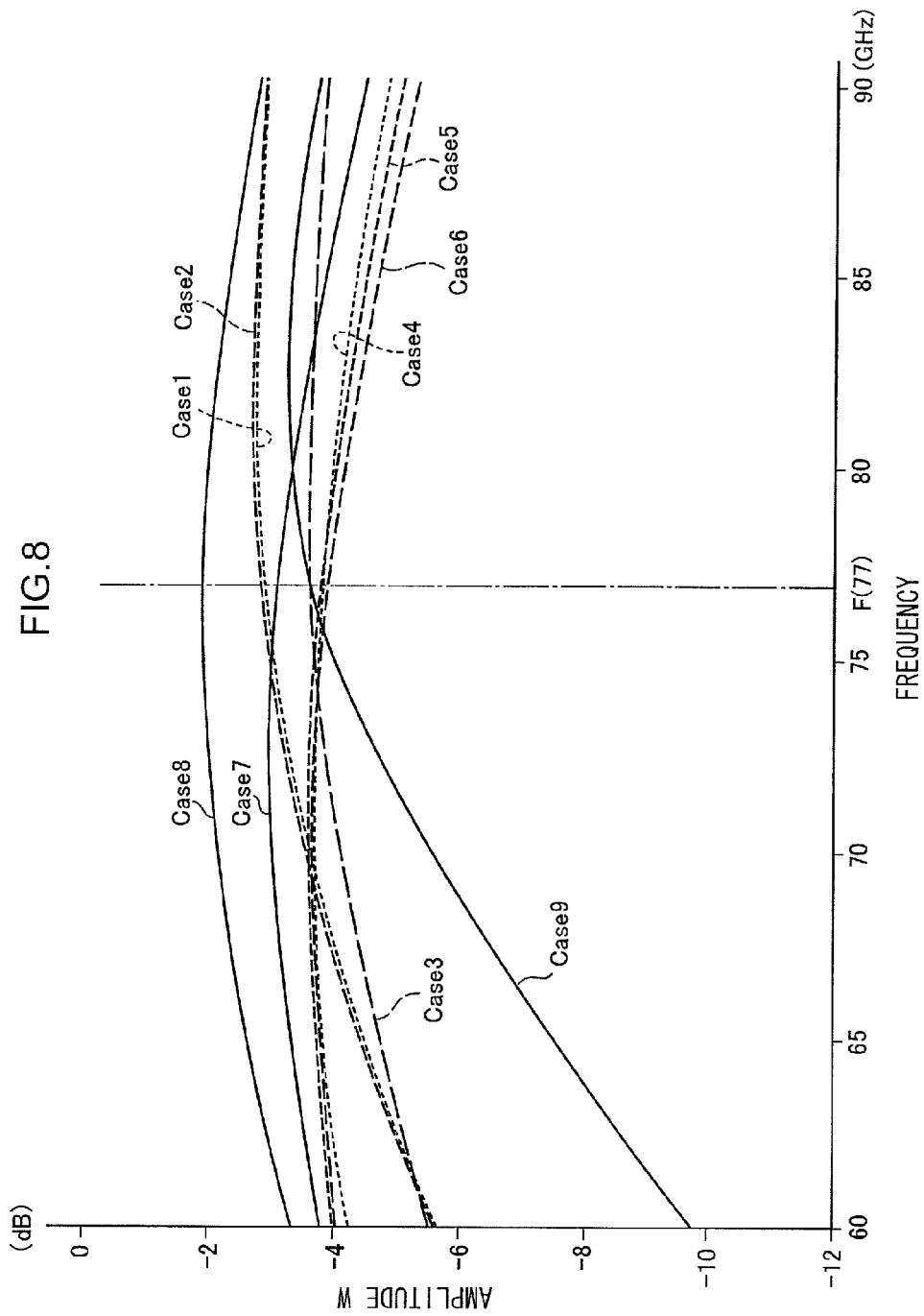
FIG. 8 is a graph illustrating simulation results of the present exemplary embodiment, and illustrates changes in amplitude with respect to frequency.
Figure 9:
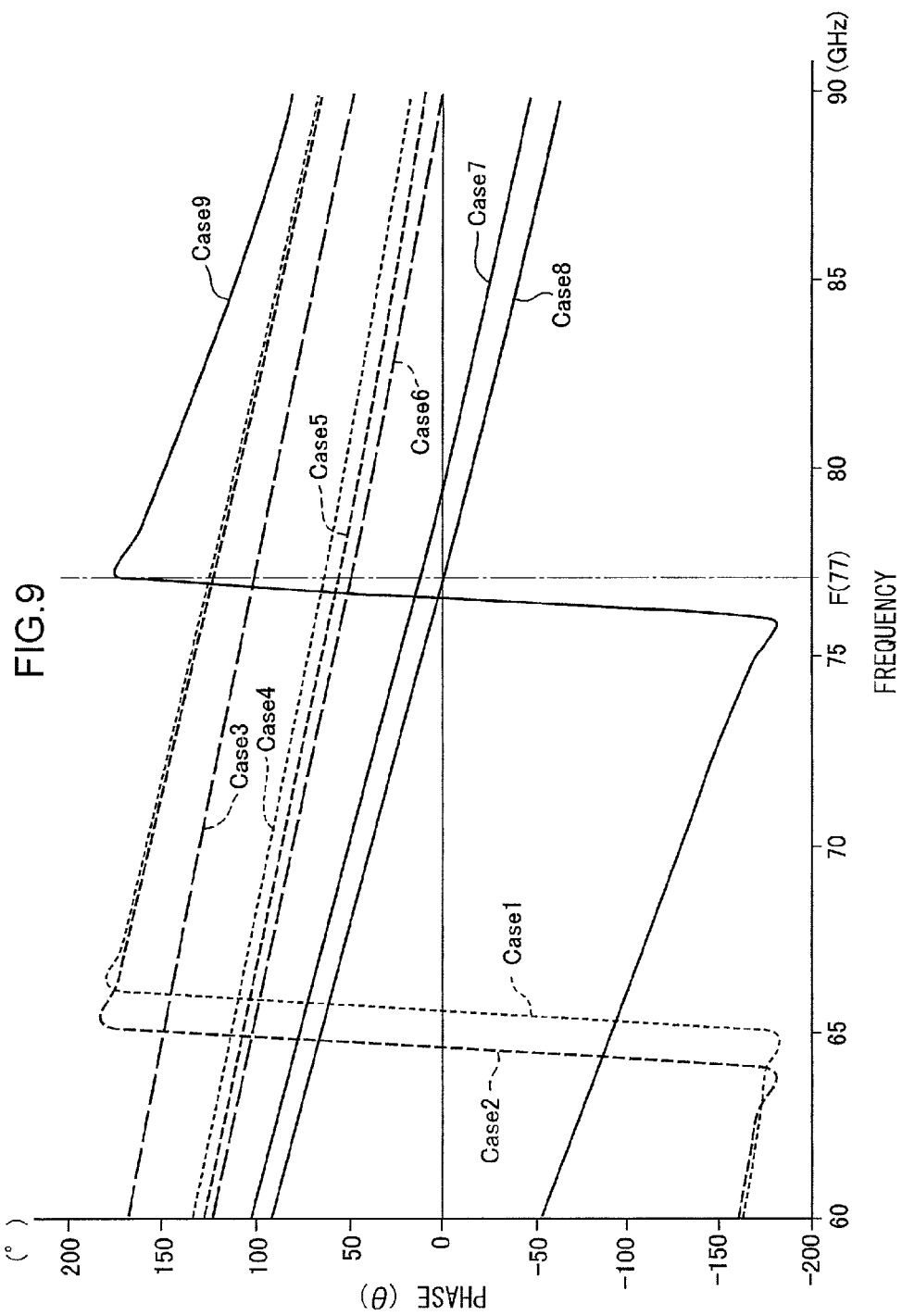
FIG. 9 is a graph illustrating simulation results of the present exemplary embodiment, and illustrates changes in phase with respect to frequency.

Thus FIG. 7 to FIG. 9 illustrate simulation results of changes in the phase θ of the output signal Sout using the variable phase shifter 10. FIG. 7 illustrates combinations of bias voltage Va of the transistor Ma, bias voltage Vb of the transistor Mb, and ON/OFF states of the transistor Mc (bias conditions) that are applied in the simulation. In the present exemplary embodiment, bias conditions are set for case 1 to case 9, and a simulation is performed with the bias voltages Va, Vb and gate voltage Vg for each case. Note that in FIG. 7, ON/OFF states of the transistor Mc are represented by the gate voltage Vg Hi (transistor Mc is ON)/low (the transistor Mc is OFF). In the present simulation the transistor Ma, Mb threshold value Vt=0.4v, the drain voltage Vd=0.8v, and bias voltages Va, Vb are set in the range 0v to Vdv.

In the variable phase shifter 10, the output signal Sout is not obtained unless at least one of the transistors Ma, Mb is operated. Moreover, in the variable phase shifter 10, the amplitude W of the output signal Sout can be made large by setting the bias voltages Va, Vb high. Thus as the bias conditions in the present exemplary embodiment, in the case 1 to case 8 where the transistor Mc is ON, at least one of the bias voltages Va, Vb is set at 0.8v, and the other is set stepwise between 0v and 0.8v.

FIG. 8 illustrates a change in amplitude W of the output signal Sout with respect to frequency F in each of the case 1 to case 9 in FIG. 7. FIG. 9 illustrates a change in phase θ of the output signal Sout with respect to frequency F in each of the case 1 to case 9 of FIG. 7.

As illustrated in FIG. 8, the amplitude W of the output signal Sout at frequency F is a maximum in case 8 and a minimum in case 6. The amplitude W of the output signal Sout in case 8 is −1.89 dB, and the amplitude W of the output signal Sout in case 6 is −3.60 dB, with a difference therebetween of 1.71 dB. Consequently, in the variable phase shifter 10 the change in the amplitude W of the output signal Sout can be suppressed to a range of 1.71 dB.

However, as illustrated in FIG. 9, the phase θ of the output signal Sout at the frequency F is θ=172.45° in case 9 where the transistor Mc is OFF. Moreover, when the transistor Mc is ON, the phase θ of the output signal Sout at frequency F is −1.14° in case 8 and is 123.97° in case 1.

Consequently, in the variable phase shifter 10, a variation range of 125° or above is obtained as the variation range of phase θ when the transistor Mc is ON. When the OFF state of the transistor Mc is included, the variable phase shifter 10 obtains a variation range of about 180° as the variation range of phase θ.

Namely, in the variable phase shifter 10, when the output signal Sout is output with phase of about 180°, the output impedance of the transistor Mc is lowered by switching the transistor Mc OFF. In the vector-synthesizer 14, the parasitic capacitance of the transistors Ma, Mb and transistor Mc give rise to the load impedances Za, Zb by the transistor Mc being OFF.

Thus by outputting signals Si, Sq with a phase difference Δθ of about 180° from the hybrid 20, the vector-synthesizer 14 is able to efficiently output the output signal Sout with phase difference Δθ by employing the signals Si, Sq output from the hybrid 20.

However, normally in order to obtain the output signal Sout with a phase θ smaller than 180° from the signals Si, Sq with a phase difference Δθ of about 180°, there is a need to employ transistors Ma, Mb with large amplification ratios A1, A2. Transistors Ma, Mb with large amplification ratios A1, A2 are transistors that are large in size, leading to an increase in parasitic capacitance.

However, in the variable phase shifter 10, the transistor Mc is provided to the vector-synthesizer 14, and the parasitic resistance 30R between the drain D and the source S of the transistor Mc is employed to slightly increase the load impedance Zb. Due to increasing the load impedance Zb, the hybrid 20 outputs signals Si, Sq with narrower phase difference Δθ than 180°. The vector-synthesizer 14 is accordingly able to output the output signal Sout in which the phase θ has been efficiently varied using the transistors Ma, Mb of small transistor size.

However, the difference between case 1 and case 2 is that the bias voltage Vb in case 1 is 0v and in contrast thereto the bias voltage Vb in case 2 is 0.2V that is lower than the threshold value Vt.

The amplitude W is −2.85 dB and the phase θ is 123.97° in case 1, whereas the amplitude W is −2.81 dB and the phase θ is 122.12° in case 2. Consequently, in the variable phase shifter 10 it is possible to operate using the bias voltage Va, Vb that is lower than the threshold value Vt in one of the transistors Ma, Mb.

The difference between case 3 and case 4 is that the bias voltage Vb is 0.4v in case 3 whereas the bias voltage Vb is 0.6v in case 4. The difference between case 6 and case 7 is that bias voltage Va is 0.6v in case 6 whereas the bias voltage Va is 0.4v in case 7.

The amplitude W is −3.61 dB and the phase θ is 100.61° in case 3, whereas the amplitude W is −3.79 dB and the phase θ 62.58° in case 4. Moreover the amplitude W is −3.89 dB and the phase θ is 47.45° in case 6, and the amplitude W is −3.10 dB and the phase θ is 11.72° in case 7.

Namely, in the variable phase shifter 10, when the bias voltage Va=0.8v, varying the bias voltage Vb in a range from 0.4v to 0.6v enables the phase θ of the output signal Sout to be varied over a range of 100° to 62°. Moreover, in the variable phase shifter 10, when the bias voltage Vb=0.8v, then varying the bias voltage Va in a range of from 0.4v to 0.6v enables the phase θ of the output signal Sout to be varied over a range of 11° to 47°.

Consequently, in the variable phase shifter 10 it is possible to vary the phase θ of the output signal Sout over a range of 0° to about 180° by employing the capacitances Cgs, Cgd that are the parasitic capacitances of the transistors Ma, Mb, Mc and the parasitic resistance 30R of the transistor Mc as the load impedances Za, Zb of the hybrid 20.

Change of the bias voltages Va, Vb is preferably performed continuously (in an analogue manner), however when the bias voltages Va, Vb are unstable, the phase θ of the output signal Sout also becomes unstable. Namely, error in the bias voltages Va, Vb gives rise to error in the phase θ of the output signal Sout.

Figure 10:
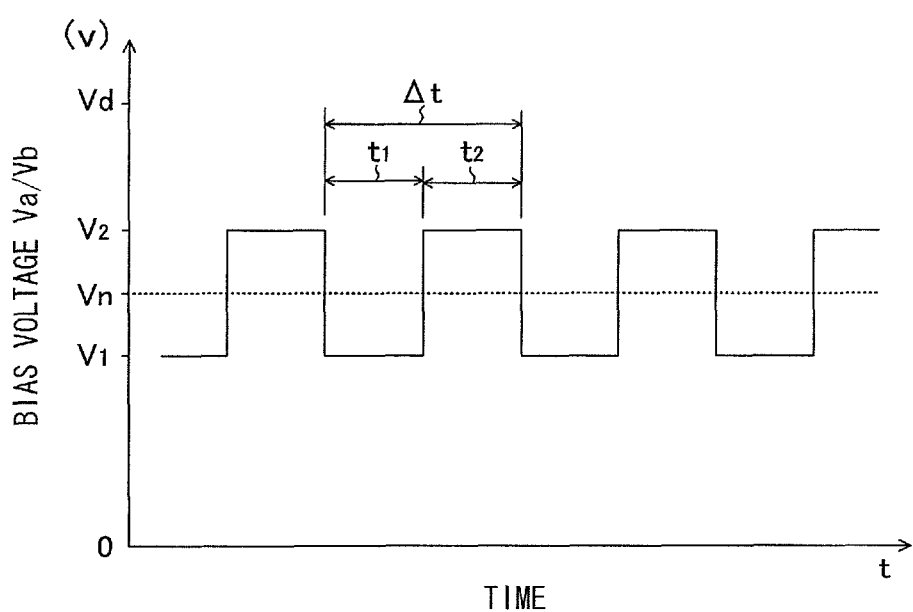
FIG. 10 is a graph illustrating an example of bias voltage control.

Accordingly, as illustrated in FIG. 10, the signal conversion section 44 outputs the voltages V1, V2 alternately in order to output the voltage Vn between the voltage V1 and voltage V2 that have been stepwise set in the voltage transformers 38, 40, as the bias voltage Va, Vb. When this is performed the signal conversion section 44 sets for the voltages V1, V2 an output time t1 of the voltage V1 and an output time t2 of the voltage V2 according to the voltage Vn. Note that in order to stabilize the phase θ of the output signal Sout, the cycle for changing the voltages V1, V2 (the time Δt for 1 cycle's worth, Δt=t1+t2) is preferably set short. As the time Δt, for example, a time of about (Tsmp/100)<Δt<(Tsmp/10) may be employed with respect to a time Tsmp to detect or measure the phase θ.

In the signal conversion section 44, for example, when the voltage Vn=(V1+V2)/2, the output time t1 of the voltage V1 and the output time t2 of the voltage V2 are set the same as each other (t1=t2). Moreover, in the signal conversion section 44, to raise the voltage Vn the output time t2 of the voltage V2 is made longer than the output time t1 of the voltage V1 in the range of time Δt for 1 cycle's worth of voltage change (Δt=t1+t2). The voltage transformers 38, 40 accordingly raise the voltage Vn towards the voltage V2. Moreover, in the signal conversion section 44, to lower the voltage Vn the output time t1 of the voltage V1 is made longer than the output time t2 of the voltage V2 (t1>t2). The voltage transformers 38, 40 accordingly lower the voltage Vn towards the V1.

The variable phase shifter 10 thereby achieves stability in the bias voltages Va, Vb, enabling the control precision of the phase θ of the output signal Sout to be improved.

In the present exemplary embodiment explained above, explanation has been given of an example of the variable phase shifter 10 in which the phase θ of the output signal Sout is variable over a range of 0° to 180° (0°≤θ≤180°), however the phase θ may be varied over a range of 0°≤θ≤360°. In such cases, configuration may be made for example with a pair of the variable phase shifters 10 provided, and with an input signal Sin input to one of the variable phase shifters 10 and an input signal −Sin of opposite phase to the input signal Sin input to the other of the variable phase shifters 10.

Moreover, in the present exemplary embodiment, the transistor Mc is employed so as to vary the load impedance Zb of the port 24B of the hybrid 20, however configuration may be made such that the transistor Mc is connected to the gate G of the transistor Ma. Moreover, as a method for varying the load of the hybrid 20, two of the transistors Mc may be provided, with each of the transistors Mc respectively connected to the transistors Ma, Mb. Namely, when the variation range of the phase θ is 90° or greater, the transistor Mc may be connected to the transistor Ma, or the transistor Mb, or both.

Moreover, in the present exemplary embodiment, the transistor Mc is employed so as to vary the load impedance Zb of the port 24B of the hybrid 20, however the configuration to vary the load impedance Zb is not limited thereto.

Figure 11:
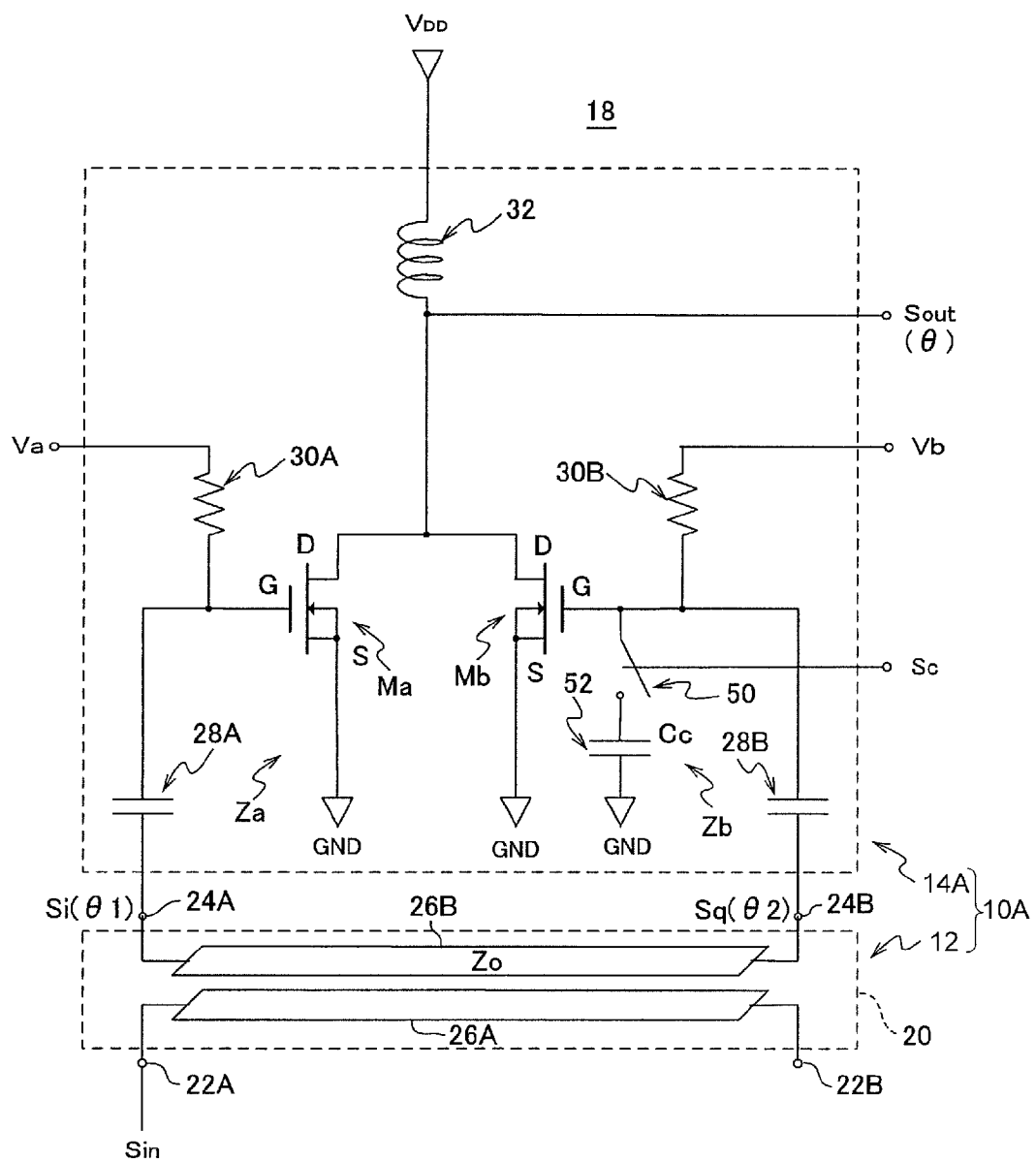
FIG. 11 is a block diagram illustrating another example of a vector-synthesizer of the variable phase shifter.

FIG. 11 illustrates a variable phase shifter 10A in which a switch 50 and a capacitor 52 are employed in place of the transistor Mc. The switch 50 functions as an example of a switch member, and the capacitor 52 functions as an example of an electrostatic capacitance element. The electrostatic capacitance element is not limited to a capacitor, and an impedance element such as a resistor may be employed therefor.

In a vector-synthesizer 14A of the variable phase shifter 10A, one contact point of the switch 50 is connected between the port 24B of the hybrid 20 and the gate G of the transistor Mb. In the vector-synthesizer 14A, the other contact point of the switch 50 is connected to ground through the capacitor 52. Based on a target value of the phase θ of the output signal Sout, the switch 50 for example opens and closes the contact points based on an operation signal Sc input from a phase controller 16.

Thus in the vector-synthesizer 14A, when the switch 50 is open, the load impedance Zb acts as input impedance of the transistor Mb. The hybrid 20 accordingly outputs signals Si, Sq with a phase difference Δθ that is about 180°.

In the vector-synthesizer 14A, the capacitance of the capacitor 52 is added to the load impedance Zb by closing the switch 50, increasing the load impedance Zb. The hybrid 20 accordingly outputs signals Si, Sq with a phase difference Δθ that is narrower than 180°.

Consequently, the variable phase shifter 10A employs a single hybrid 20 to enable the phase θ of the output signal Sout to be output over a variable range of 0° to 180°. Note that a capacitance Cc of the capacitor 52 is the load impedance Zb including the input impedance of the transistor Mb, and is preferably is a small capacitance of a capacitance that does not exceed the characteristic impedance Zo of the hybrid 20. Moreover, configuration may be made with any given impedance element, such as an electrical resistor of a specific resistance value, employed to form a load impedance. Moreover, a transmission gate may be employed as the switch 50, thereby enabling the capacitor 52 to be omitted.

According to an aspect of technology disclosed herein, the variable phase range employed in phase can be made 90° or greater by employing a single transmission line, thereby enabling the surface area of a device to be suppressed from increasing.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The technology disclosed herein is not limited to the exemplary embodiments described above, and each section may be implemented in any manner that exhibits the desired function. All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. A variable phase shifter, comprising:
    a transmission line that outputs quadrature signals from a pair of output ports in response to an input signal of a specific frequency;
    a synthesizer that includes a first transistor connected to a first port of the pair of output ports and a second transistor connected to a second port of the pair of output ports so that parasitic capacitance of the first transistor and the second transistor becomes load impedance for the transmission line, and that inputs signals output from the pair of output ports of the transmission line with a phase difference according to their respective load impedances, on input of the input signal, to the first transistor and the second transistor and combines the signals, which are amplified and output by the first transistor and the second transistor; and
    a phase controller that controls the phase of the output signal that is combined and output by the synthesizer by controlling the amplification operation of each of the first and second transistors of the synthesizer.

2. The variable phase shifter of claim 1, wherein
    the phase controller controls bias voltages respectively applied to gates of each of the first and second transistors connected to the pair of output ports based on a target phase of the output signal.

3. The variable phase shifter of claim 2, wherein
the phase controller includes:
- a power source section that outputs a stepwise set voltage; and
- a voltage controller that controls the power source section so as to output as a bias voltage a voltage set based on the target phase from out of the stepwise set voltages.

4. The variable phase shifter of claim 3, wherein
when from out of the stepwise set voltages a third voltage between the first voltage and the second voltage is output from the power source section as the bias voltage, the phase controller controls the output time of the first voltage and the output time of the second voltage base on the first, second and third voltages.

5. The variable phase shifter of claim 2, further comprising:
an electrostatic capacitance element of specific electrostatic capacitance connected to the first or the second port of the pair of output ports so as to configure the load impedance; and
a switch member that switches the load impedance by disconnecting and connecting the electrostatic capacitance element from the output port to which the electrostatic capacitance element was connected, wherein
the phase controller controls to switch the load impedance using the switch member based on the target phase.

6. The variable phase shifter of claim 5, wherein
the switch member is a third transistor, and electrostatic capacitance of the electrostatic capacitance element is parasitic capacitance of the third transistor.

7. The variable phase shifter claim 2, further comprising:
a third transistor that is connected to the first or second port of the pair of output ports, and whose parasitic capacitance is added as the load impedance by ON operation of the third transistor, wherein
the phase controller controls switching operation of the third transistor based on the target phase.

8. A semiconductor integrated circuit, comprising:
a variable phase shifter that includes:
a synthesizer that, for a transmission line that outputs quadrature signals from a pair of output ports in response to an input signal of a specific frequency, includes a first transistor connected to a first port of the pair of output ports and a second transistor connected to a second port of the pair of output ports so that parasitic capacitance of the first transistor and the second transistor becomes load impedance for the transmission line, and that inputs signals output from the pair of output ports of the transmission line with a phase difference according to their respective load impedances, on input of the input signal, to the first transistor and the second transistor and combines the signals, which are amplified and output by the first transistor and the second transistor; and
a phase controller that controls the phase of the output signal that is combined and output by the synthesizer by controlling the amplification operation of each of the first and second transistors of the synthesizer.

9. The semiconductor integrated circuit of claim 8, further comprising:
the transmission line.

10. The semiconductor integrated circuit of claim 8, wherein
the phase controller includes:
- a power source section that outputs a stepwise set voltage; and
- a voltage controller that controls the power source section so as to output as respective bias voltages to the first and second transistors a voltage set for the target phase from out of the stepwise set voltages.

11. The semiconductor integrated circuit of claim 10, further comprising:
an electrostatic capacitance element of specific electrostatic capacitance connected to the first or the second port of the pair of output ports so as to configure the load impedance; and
a switch member that switches the load impedance by disconnecting and connecting the electrostatic capacitance element from the output port to which the electrostatic capacitance element was connected, wherein
the phase controller controls to switch the load impedance using the switch member based on the target phase.

12. The semiconductor integrated circuit of claim 11, wherein
the switch member is a third transistor, and electrostatic capacitance of the electrostatic capacitance element is parasitic capacitance of the third transistor.

13. The semiconductor integrated circuit of claim 10, further comprising:
a third transistor that is connected to the first or second port of the pair of output ports, and whose parasitic capacitance is added as the load impedance by ON operation of the third transistor, wherein
the phase controller controls switching operation of the third transistor based on the target phase.

14. A phase shifting method, comprising:
for a transmission line that outputs quadrature signals from a pair of output ports in response to an input signal of a specific frequency, connecting a first transistor to a first port of the pair of output ports and connecting a second transistor (Mb) to a second port of the pair of output ports so that parasitic capacitance of the first transistor and the second transistor becomes load impedance for the transmission line;
inputting signals output from the pair of output ports of the transmission line with a phase difference according to the their respective load impedance, on input of the input signal, to the first transistor and the second transistor, and combining the signals, which are amplified and output by the first transistor and the second transistor; and
controlling the phase of the combined output signal by controlling the amplification operation of each of the first and second transistors.

15. The phase shifting method of claim 14, wherein
the phase and amplitude of the output signal is controlled by controlling respective bias voltages applied to gates of the first and second transistors connected to the pair of ports.

16. The phase shifting method of claim 14, further comprising:
connecting an electrostatic capacitance element of specific electrostatic capacitance to the first or the second port of the pair of output ports;
connecting a switch member so as to disconnect and connect the electrostatic capacitance element from the output port to which the electrostatic capacitance element was connected; and
switching the load impedance using the switch member based on a target phase.

17. The phase shifting method of claim 16, wherein
a third transistor is employed as the switch member so that parasitic capacitance configures electrostatic capacitance of the electrostatic capacitance element.

18. The phase shifting method of claim 14, further comprising:
connecting a third transistor to the first or second port of the pair of output ports so that parasitic capacitance is added as the load impedance by ON operation of the third transistor; and
controlling switching operation of the third transistor based on the target phase.

* * * * *